United States Patent
Hilbers

(10) Patent No.: US 9,449,865 B2
(45) Date of Patent: Sep. 20, 2016

(54) ELECTROSTATIC CLAMP, LITHOGRAPHIC APPARATUS AND METHOD

(71) Applicant: ASML Netherlands B.V., Veldhoven (NL)

(72) Inventor: Alexander Petrus Hilbers, Velsen-Noord (NL)

(73) Assignee: ASML Netherlands B.V., Veldhoven (NL)

( * ) Notice: Subject to any disclaimer, the term of this patent is extended or adjusted under 35 U.S.C. 154(b) by 67 days.

(21) Appl. No.: 14/400,825

(22) PCT Filed: Jun. 25, 2013

(86) PCT No.: PCT/EP2013/063210
§ 371 (c)(1),
(2) Date: Nov. 13, 2014

(87) PCT Pub. No.: WO2014/012749
PCT Pub. Date: Jan. 23, 2014

(65) Prior Publication Data
US 2015/0138688 A1    May 21, 2015

Related U.S. Application Data

(60) Provisional application No. 61/672,515, filed on Jul. 17, 2012.

(51) Int. Cl.
*H01T 23/00* (2006.01)
*H01L 21/683* (2006.01)
(Continued)

(52) U.S. Cl.
CPC ....... *H01L 21/6831* (2013.01); *G03F 7/70708* (2013.01); *H01L 21/6833* (2013.01); *G03F 7/707* (2013.01); *H02N 13/00* (2013.01); *H05K 3/4007* (2013.01)

(58) Field of Classification Search
USPC .................................. 361/230, 234
See application file for complete search history.

(56) References Cited

U.S. PATENT DOCUMENTS 5,583,736 A    12/1996 Anderson et al.
5,841,624 A    11/1998 Xu et al.
(Continued)

FOREIGN PATENT DOCUMENTS

EP          1 220 311 A2    7/2002
WO    WO 2012/076207 A1    6/2012

OTHER PUBLICATIONS

International Search Report directed to related International Patent Application No. PCT/EP2013/063210, mailed Aug. 30, 2013; 5 pages.

(Continued)

*Primary Examiner* — Danny Nguyen
(74) *Attorney, Agent, or Firm* — Sterne, Kessler, Goldstein & Fox P.L.L.C.

(57) ABSTRACT

The present invention provides a method for containing unwanted electric charge that accumulates on the surface of the dielectric of an electrostatic clamp. One source of such charge is found to be from the triple points where conductive interconnect lines 28 and conductive burl coatings 26 contact the surface of the dielectric 20. These triple points are potted by means of an insulating material 29 such that any emitted electrons are contained. While the interconnect lines 28 are completely covered, in the case of the conductive burl coating 26 although the burl 25 cannot be completely covered by the insulating material, the triple point is moved to a region where there is no or at least only low electric field whereby there is no or only little emission of electrons.

11 Claims, 5 Drawing Sheets

(51) Int. Cl.
  *H02N 13/00* (2006.01)
  *H05K 3/40* (2006.01)
  *G03F 7/20* (2006.01)

(56) References Cited

U.S. PATENT DOCUMENTS 7,092,231 B2 * 8/2006 Hoeks ............... G03F 7/707
                                                    355/72
7,626,681 B2 * 12/2009 Sutedja ............. G03F 7/70991
                                                    355/53

| 2004/0114124 | A1 | 6/2004 | Hoeks et al. |
| 2009/0079525 | A1 | 3/2009 | Sijben |
| 2012/0024585 | A1 | 2/2012 | Hilbers et al. |

OTHER PUBLICATIONS

Internatioal Preliminary Report on Patentability and Written Opinion of the International Searching Authority directed to related International Patent Application No. PCT/EP2013/063210, issued Jan. 20, 2015; 6 pages.

* cited by examiner

ELECTROSTATIC CLAMP, LITHOGRAPHIC APPARATUS AND METHOD

FIELD

The present invention relates to an electrostatic clamp for holding an object, a lithographic apparatus and a method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Electrostatic clamps may be used in lithographic apparatuses operating at certain wavelengths, e.g. EUV, since at these wavelengths, certain regions of the lithographic apparatus operates under vacuum conditions. An electrostatic clamp may be provided to electrostatically clamp (i.e. hold) an object, such as a mask or a substrate (wafer) to an object support, such as a mask table or a wafer table, respectively. Such a clamp may be described as an object holder. Alternatively and/or additionally, the clamp may form part of an object holder. The object holder might sometimes be described, alternatively and/or additionally, as an object support.

The voltage which is applied to an electrostatic clamp may be considerable. For example, the voltage may be of the order of kilovolts. An insulating barrier is conventionally located over an electrode of an electrostatic clamp, the insulating barrier acting to insulate an object such as a substrate from the voltage applied to the electrode. One or more burls may be provided on the surface of the insulating barrier which may be provided with a conductive coating that reduces the clamping force in the region of the burls. Further, the burls may be interconnected by conductor lines provided on the surface of the insulating barrier.

A problem exists in that the conductive coating over the burls and the interconnecting conductor lines are known to emit electrons that accumulate as a static charge on the surface of the insulating barrier. Because of the insulating barrier this static charge cannot dissipate and instead accumulates over time and is superimposed on the high voltage provided by the electrode(s). This results in local variations in the clamping force that are undesirable. While the accumulated static charge can be removed by, for example, cleaning the clamp with isopropyl alcohol, this requires removing the clamp from within a high vacuum apparatus and this is not a practicable solution.

It is desirable to provide, for example, an improved electrostatic clamp which obviates or mitigates one or more of the problems of the prior art, whether identified herein or elsewhere.

SUMMARY

According to a first an aspect of the invention there is provided an electrostatic clamp configured to hold an object, the electrostatic clamp comprising, a dielectric portion formed from a dielectric material, said dielectric portion having a first surface facing an object to be clamped and a second surface opposed to said first surface, an electrode provided on said second surface, and at least one conductive burl contacting the first surface of the dielectric portion, wherein at least the contact point where the conductive burl contacts the dielectric portion is covered by an insulating material, characterised in that the burl extends above the insulating material such that the junction between the conductive burl and a top surface of the insulating material is in a region where there is no or only low electric field.

In embodiments of the invention the conductive burl may be a burl provided with a conductive coating. In an embodiment an electrical interconnect line may be provided on the first surface.

In some embodiments of the invention the insulating material may completely cover the conductive element where the conductive element is an electrical interconnect.

In some embodiments of the invention the electrostatic clamp may comprise a plurality of conductive burls, a plurality of electrical interconnect lines, and a plurality of contact points and wherein said plurality of contact points are covered by a single layer of insulating material.

The electrostatic clamp may be a bipolar clamp further comprising a second electrode disposed adjacent to the electrode, the second electrode being separated from the electrode, the second electrode being configured to receive a voltage which is of opposite sign to the voltage received by the electrode.

In embodiments of the invention the electrode may be generally rectangular, or may be generally in the shape of a segment of a circle.

According to a second aspect of the invention there is provided an apparatus comprising: an object holder constructed and arranged to hold an object, wherein said object holder comprises an electrostatic clamp according to the first aspect of the invention.

According to a third aspect of the invention there is provided a method comprising:

providing an object;

providing an electrostatic clamp, the clamp comprising, a dielectric portion formed from a dielectric material, said dielectric portion having a first surface facing an object to be clamped and a second surface opposed to said first surface, an electrode provided on said second surface, and at least one conductive burl contacting the first surface of the dielectric portion, wherein at least the contact point where the conductive element contacts the dielectric portion is covered by an insulating material;

the method further comprising using the electrostatic clamp to hold the object by applying a voltage between the electrode and the object, characterised in that the burl extends above the insulating material such that the junction between the conductive burl and a top surface of the insulating layer is in a region where there is no or only low electric field.

One or more aspects of the invention may, where appropriate to one skilled in the art, be combined with any one or more other aspects described herein, and/or with any one or more features described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
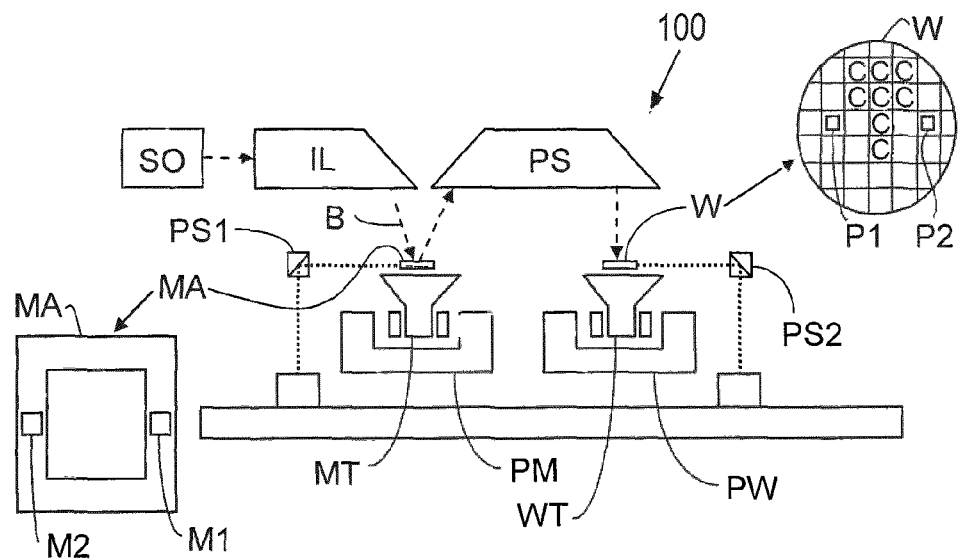
FIG. 1 schematically depicts a lithographic apparatus according to an embodiment of the invention.

FIG. 1 schematically depicts a lithographic apparatus 100 including a source collector apparatus SO according to one embodiment of the invention. The apparatus comprises:
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:
1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
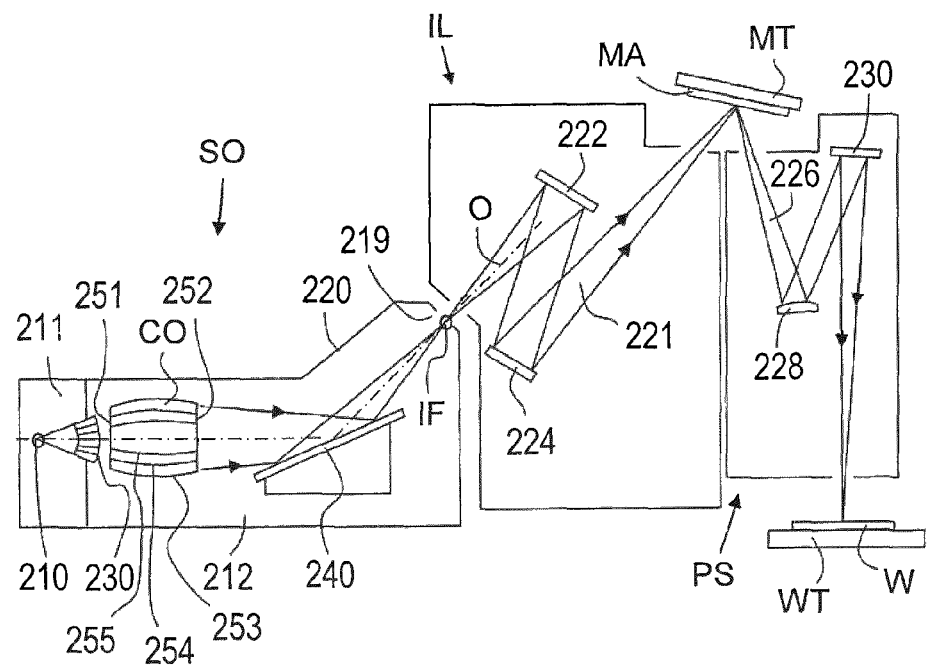
FIG. 2 is a more detailed schematic view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
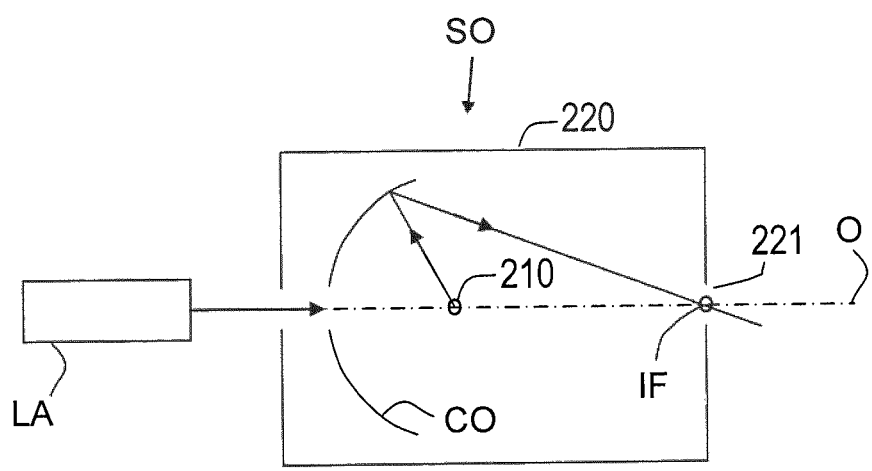
FIG. 3 is a more detailed schematic view of the source collector apparatus SO of the apparatus of FIGS. 1 and 2.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
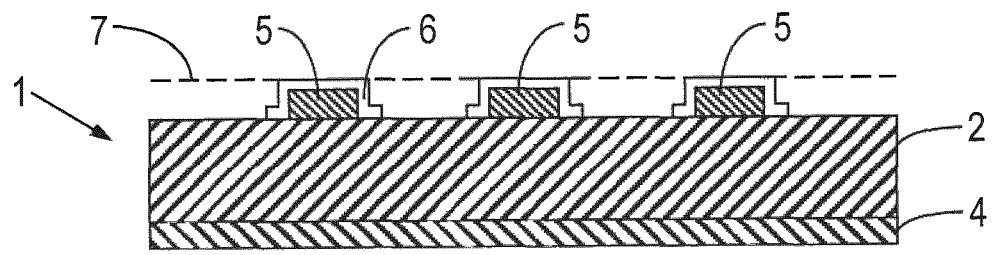
FIG. 4 schematically shows in cross-section part of a prior art electrostatic clamp.

FIG. 4 depicts in cross-section part of an electrostatic clamp 1 according to the prior art, which may be used to clamp an object such as a mask (or other patterning device) or wafer (or other substrate). The clamp 1 comprises a dielectric portion 2 formed from a dielectric material, and an electrode 4. The dielectric material may be any conventional known dielectric material but a glass is particularly preferred. A plurality of burls 5 are located on an upper surface of the dielectric portion 2. The burls 5 may be formed from a dielectric material and may be provided with a conductive coating 6 (eg a coating of TiN or CrN) such that they may be grounded to reduce the clamping force in the region of the burls so that the wafer (or other substrate) can be removed from the burls. Alternatively the burls themselves may be made of a conductive material. Upper surfaces of the burls determine a plane 7 at which a lower surface of an object (not shown) such as a wafer is to be held. The electrode 4 is provided on an opposing surface of the dielectric portion 2 to the burls 5.

The electrode 4 is configured to be held at a voltage to generate an electrostatic clamping force between the clamp 1 and an object. The object may be held in plane 7 by an electrostatic clamping force when a voltage is applied to the electrode 4. The electrostatic or Coulomb clamping pressure (clamping force per unit area), can be related to the applied voltage according to the formula:

$$P = \tfrac{1}{2} \in E^2 \qquad (1)$$

where:

P is the Coulomb clamping pressure exerted on the object to be clamped;

$\in$ is the dielectric constant of the material between the electrode and the object to be clamped; and E is the electrical field strength experienced by the clamped object. Equation 1 describes the general case where there is a single dielectric medium between an electrode and an object to be clamped. However, it will be understood that in the case where the dielectric comprises a dielectric material and a vacuum gap the dielectric constant and electric field terms will be replaced by terms reflecting the particular combination of materials and/or media involved. In general, the electrical field strength E is proportional to the voltage V applied to electrode 4, and is inversely proportional to the thickness of the dielectric layer(s).

Clamping force can be increased by reducing the thickness of the dielectric portion 2, reducing the separation between the plane 7 in which the object is to be clamped and the electrode 4 and increasing the capacitance of the dielectric portion. However, as the thickness of the dielectric portion 2 is reduced, this increases the risk of breakdown causing a short-circuit between the electrode 4 and the object being clamped or since the burls 5 are conductive or coated with a conductor (and connected to ground), between the electrode 4 and the burls 5. If a short-circuit or any significant discharge occurs between the electrode 4 and a grounded part of the system, then the voltage between the electrode 4 and the object may fall, and clamping force may be significantly reduced as it depends on the square of the voltage. Damage may also be caused to the electrostatic clamp 1.

Figure 5:
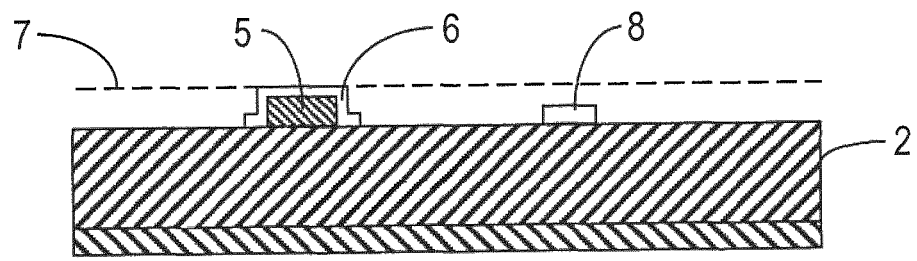
FIG. 5 schematically shows in cross-section part of a different prior art electrostatic clamp.

FIG. 5 depicts schematically in cross-section another form of electrostatic clamp according to the prior art in which electrical interconnects 8 are provided on the surface of the dielectric material 2 and which interconnects are used to connect together the burls 5.

Figure 6:
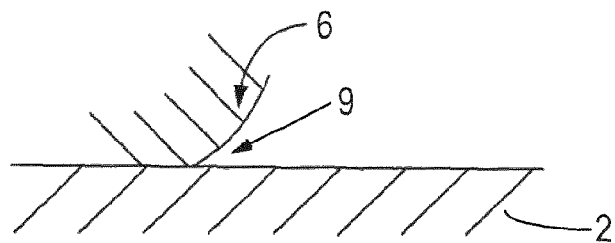
FIG. 6 schematically shows in cross-section a detail of the electrostatic clamp of FIG. 4.

As discussed above one problem with the prior art is that the conductive coatings provided to the burls—or the burls themselves if they are formed to be conductive—and the conductive interconnect lines (if provided) may act as sources of electrons that are emitted and which settle on the surface of the dielectric material and which accumulate there over time thus creating an undesirable static charge. This problem is particularly acute at so-called triple points where the conductive material contacts the dielectric material in a vacuum. FIG. 6 shows a detail of the region where a conductive coating 6 of a burl 5 contacts the surface of the dielectric material 2. From FIG. 6 it can be seen that rather than a vertical edge of the conductive coating contacting the dielectric surface, the edge of the conductive material tends to slant inwards for various reasons relating the manner in which conductive coating is formed. For a number of reasons a very high electric field is generated in the space 9 between the edge of the conductive coating and the surface of the dielectric material which further exacerbates the problem of the generation of electrons. The electric field is high for example because the electric field generated at an edge of a conductor is inversely proportional to the radius of the edge, so the sharper the edge the smaller the radius and thus the higher the electric field. Furthermore, the electric field that is generated is amplified by a factor that at its maximum (where the electric field crosses the dielectric at an angle perpendicular to its surface) is the ratio of the dielectric constant of the dielectric material and the dielectric constant of the vacuum, ie $\in_{dielectric}/\in_{vacuum}$. Where the dielectric is a glass as in an electrostatic clamp $\in_{dielectric}$ may be around 5.1 and therefore there is a maximum amplification factor of 5.1 (the dielectric constant of a vacuum being defined as 1). Although the magnification will be less where the field is at an angle to the dielectric surface, nevertheless this very high field means that this triple point is known as a hot triple point and emission of electrons is likely.

Figure 7:
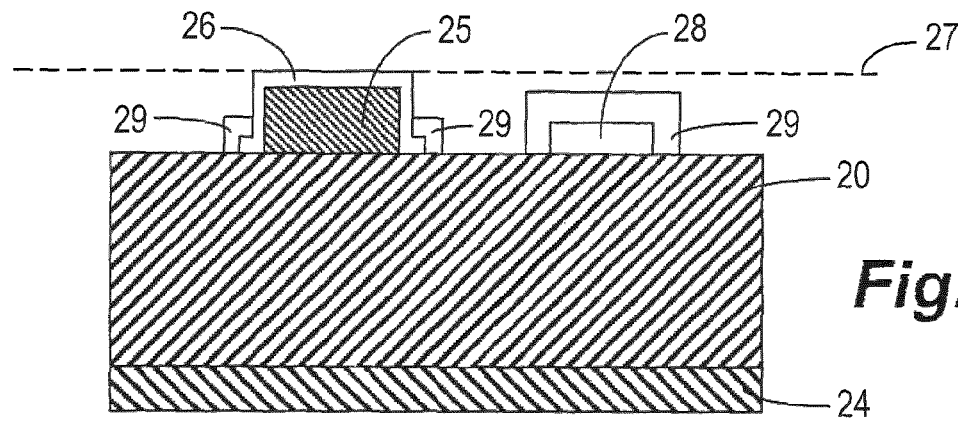
FIG. 7 schematically shows in cross-section an electrostatic clamp according to a first embodiment of the invention.

FIG. 7 shows an embodiment of the invention. In this embodiment the upper surface of the dielectric material 20 is provided with a burl 25 coated with conducting material 26 defining a supporting plane 27. Electrode 24 is provided on the underside of the dielectric material 20. Also provided on the upper surface of the dielectric material 20 is at least one electrical interconnect line 28. In this embodiment of the invention both the burl 25 and the at least one interconnect line 28 are covered with an insulating material 29 that covers at least the triple points where the conducting material 26 and the interconnect line 28 contact the dielectric surface. The insulating material 29 does not cover all of the burl 25 but does at least cover the junction where conducting material 26 covering the burl 25 contacts the dielectric material 20, and preferably covers at least all of the interconnect line 28. The presence of the insulating material 29 means that electrons cannot be emitted from the conducting material 26 covering the burl 25, in particular from the junction where the conducting material contacts the dielectric material, or the interconnect line 28 and therefore cannot accumulate on the surface of the dielectric material 20.

The insulating material 29 may, for example, be a polymer material that is sprayed onto the dielectric surface and then baked. Another option may be spin-coating of a polymer material. Important characteristics of the insulating material are that it has a high dielectric constant with low leakage. The insulating material may also be a layer of silicon dioxide.

Figure 8:
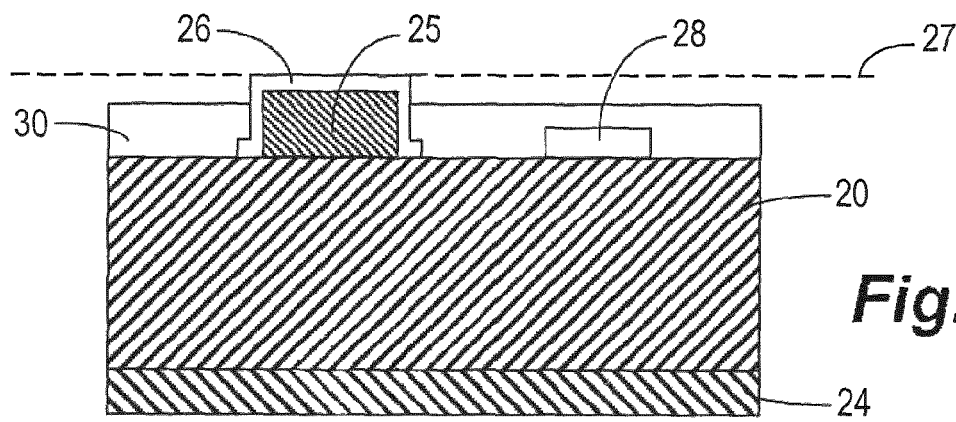
FIG. 8 schematically shows in cross-section an electrostatic clamp according to a second embodiment of the invention.

FIG. 8 shows a second embodiment of the invention in which rather than having separate regions of insulating material covering the burls and the interconnect lines, instead a single layer of insulating material 30 is provided on the surface of the dielectric material to a depth that covers at least the junctions between the conductive material 26 of the burl 25 and the dielectric material 20, ie triple points, and covers completely the electrical interconnects 28. Again, in this embodiment the electrode 24 is provided on the side of the dielectric material 20 opposite from the side of the dielectric material 20 that faces an object to the held.

It should be noted that in the embodiments of FIGS. 7 and 8 there will still be a triple point where the insulating material 29 (FIG. 7) or 30 (FIG. 8) contacts the vertical sides of the conducting material 26 covering the burls 25. However, the junction between the vertical sides of the conducting material 26 and the insulating material 29, 30 lines in a region where there is either zero or at least very low electric field. Such a junction would not act as a source of electrons to any significant extent. In a particularly preferred situation the junction defines a substantially 90° angle and thus even at a high voltage there is very low electric field at this junction.

Figure 9:
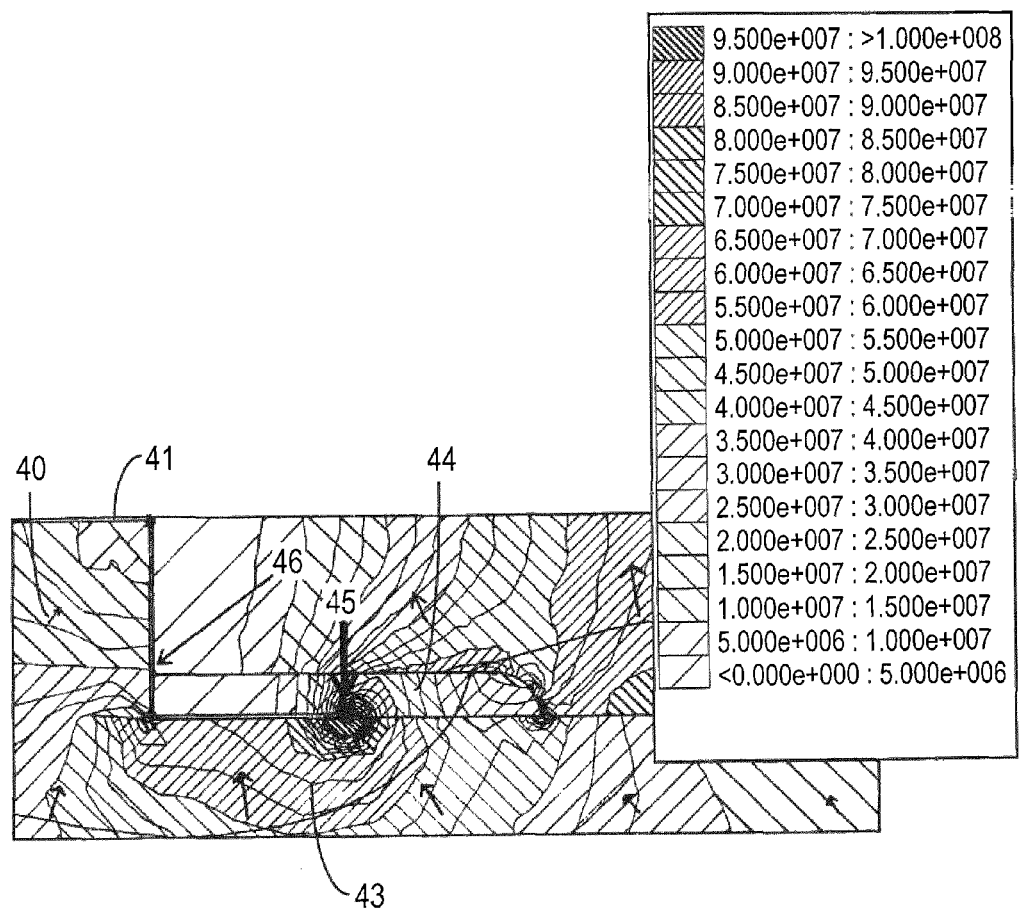
FIG. 9 illustrates modelled electric field strengths explaining in an embodiment of the invention.

FIG. 9 shows in particular the electric fields as modelled in the location of a burl 40 provided with a conductive coating 41 with the junction between the conductive coating 41 of the burl 40 with the dielectric portion 43 being covered by an insulating material 44. In this plot the strength of the field is measured in V/m and the more densely hatched regions of the plot correspond to regions of the highest electric field. It will be noted in particular that the hot triple point 45 where the edge of the conductive coating of the burl contacts the dielectric portion 43 is fully covered by the insulating material and any charge emitted is contained therein. Meanwhile a new triple point 46 is defined by the junction of the conductive coating 41 and the insulating material 44 but as this triple point is located in a region of low or even zero electric field it is a "cold" triple point and there is little or no electron emission. Thus, while there remains a triple point it has been moved from a region of high electric field to one of zero or low electric field.

The electrostatic clamp may be configured to provide a minimum clamping pressure of 50 mbar. If the height of the burls is 10 microns, then the voltage applied to the electrode may be at least 300V. Higher or lower voltages may be applied to the electrode. For example up to 1000V or more may be applied to the electrode.

The electrostatic clamp may have any suitable shape. The electrostatic clamp may for example be rectangular, and may thus be suitable for clamping a mask (or other rectangular object). The electrostatic clamp may for example have the general shape of a segment of a circle, and may thus be suitable for clamping a wafer (or other circular substrate).

In the above description reference has been made to ground. Ground may be at zero volts or may have some other fixed voltage (voltages applied to the electrode(s) being determined relative to that fixed voltage). An advantage of ground being at zero volts is that it may be connected to parts of the lithographic apparatus.

In an embodiment, a channel may be provided inside the clamp through which cooling fluid such as water may be circulated.

The dielectric portion 2,20 of the electrostatic clamp may comprise a single layer of dielectric. Alternatively, the dielectric portion may comprise two or more stacked layers of dielectric.

In an embodiment, the clamp may be double sided. For example, two electrodes spaced apart may be provided within a resistive portion, with the insulating portion being provided both on the top and the bottom surfaces of the resistive portion. The double sided clamp may provide clamping on one side to a substrate table, and clamping on an opposite side to a substrate (or other object).

In the above description reference has been made to terms such as "top", "bottom" and the like and it should be understood that these terms are used only for convenience with reference to the figures and should not be understood as implying any particular orientation for embodiments of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measure or process an object such as a wafer (or other substrate) or mask (or other patterning device) either in vacuum or in ambient (non-vacuum) conditions, such as, for example in plasma etching apparatus or deposition apparatus.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultraviolet (EUV) radiation (e.g. having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The description is not intended to limit the invention.

What is claimed is:

1. An electrostatic clamp configured to hold an object, the electrostatic clamp comprising:
    a dielectric portion formed from a dielectric material, said dielectric portion having a first surface facing an object to be clamped and a second surface opposed to said first surface;
    an electrode provided on said second surface; and
    at least one conductive burl contacting the first surface of the dielectric portion,
    wherein at least the contact point where the conductive burl contacts the dielectric portion is covered by an insulating material, and wherein said burl extends above said insulating material such that the junction between the conductive burl and a top surface of said insulating material is in a region where there is no or only low electric field.

2. An electrostatic clamp as claimed in claim 1 wherein the conductive burl is a burl provided with a conductive coating.

3. An electrostatic clamp as claimed in claim 1 wherein an electrical interconnect line is provided on said first surface.

4. An electrostatic clamp as claimed in claim 3 wherein the insulating material completely covers the electrical interconnect line.

5. An electrostatic clamp as claimed in claim 4 comprising a plurality of burls, a plurality of electrical interconnect lines and a plurality of contact points and wherein said plurality of contact points are covered by a single layer of insulating material.

6. An electrostatic clamp as claimed in claim 1 wherein said clamp is a bipolar clamp further comprising a second electrode disposed adjacent to the electrode, the second electrode being separated from the electrode, the second electrode being configured to receive a voltage which is of opposite sign to the voltage received by the electrode.

7. An electrostatic clamp as claimed in claim 1 wherein said electrode is generally rectangular.

8. An electrostatic clamp as claimed in claim 1 wherein said electrode is generally in the shape of a segment of a circle.

9. An apparatus comprising:
    an object holder constructed and arranged to hold an object, wherein said object holder comprises an electrostatic clamp as claimed in claim 1.

10. Apparatus as claimed in claim 9, wherein said apparatus is a lithographic apparatus.

11. A method comprising:
    providing an object;
    providing an electrostatic clamp, the clamp comprising, a dielectric portion formed from a dielectric material, said dielectric portion having a first surface facing an object to be clamped and a second surface opposed to said first surface, an electrode provided on said second surface, and at least one conductive burl contacting the first surface of the dielectric portion, wherein at least the contact point where the conductive burl contacts the dielectric portion is covered by an insulating material;
    the method further comprising using the electrostatic clamp to hold the object by applying a voltage between the electrode and the object,
    wherein said burl extends above said insulating material such that the junction between the conductive burl and a top surface of said insulating layer is in a region where there is no or only low electric field.

* * * * *